United States Patent [19]

Meroth

[11] Patent Number: 5,587,124

[45] Date of Patent: Dec. 24, 1996

[54] METHOD OF MAKING SYNTHETIC DIAMOND FILM WITH REDUCED BOWING

[76] Inventor: John Meroth, 333 Howard St., Northboro, Mass. 01532

[21] Appl. No.: 270,656

[22] Filed: Jul. 5, 1994

(Under 37 CFR 1.47)

[51] Int. Cl.$^6$ .............. B29C 11/00; B28B 35/00
[52] U.S. Cl. .............. 264/430; 264/1.21; 264/81; 264/483
[58] Field of Search .................. 264/1.21, 430, 264/483, 81

[56] References Cited

U.S. PATENT DOCUMENTS

| | | | |
|---|---|---|---|
| 4,471,003 | 9/1984 | Cann | 427/34 |
| 4,487,162 | 12/1984 | Cann | 118/723 |
| 4,707,384 | 11/1987 | Schachner et al. | 427/249 |
| 4,900,628 | 2/1990 | Ikegaya et al. | 428/408 |
| 4,987,002 | 1/1991 | Sakamoto et al. | 427/249 |
| 4,988,421 | 1/1991 | Drawl et al. | 204/192 |
| 5,006,203 | 4/1991 | Purdes | 156/646 |
| 5,114,745 | 5/1992 | Jones | 427/113 |
| 5,124,179 | 6/1992 | Garg et al. | 427/249 |
| 5,139,372 | 8/1992 | Tanabe et al. | 407/118 |
| 5,204,144 | 4/1993 | Cann et al. | 427/569 |
| 5,260,106 | 11/1993 | Kawarada et al. | 427/577 |
| 5,270,077 | 12/1993 | Knemeyer et al. | 427/249 |
| 5,294,381 | 3/1994 | Iguchi et al. | 264/25 |
| 5,310,512 | 5/1994 | Bigelow | 264/25 |
| 5,314,652 | 5/1994 | Simpson et al. | 264/81 |

FOREIGN PATENT DOCUMENTS

| | | |
|---|---|---|
| 0442303A1 | 8/1991 | European Pat. Off. |
| 0523968A1 | 1/1993 | European Pat. Off. |
| 63307196 | 4/1989 | Japan. |

OTHER PUBLICATIONS

Abstract (Dialog) From Diamond Film Update of Jun. 16, 1994 –"CVD Diamond Film Without Stress Cracks" (1 sheet).

Primary Examiner—Christopher A. Fiorilla
Attorney, Agent, or Firm—Volker R. Ulbrich; Martin M. Novack

[57] ABSTRACT

A method for depositing synthetic diamond includes the following steps: (a) providing a deposition chamber; (b) providing a deposition surface in the deposition chamber, the deposition surface having a concave contour; (c) directing a plasma toward the concave deposition surface, the plasma including hydrogen and a hydrocarbon, such that synthetic diamond is formed on the concave deposition surface; and (d) releasing the synthetic diamond from the concave deposition surface to obtain free standing diamond, wherein the released diamond generally flattens.

12 Claims, 1 Drawing Sheet

5,587,124

METHOD OF MAKING SYNTHETIC DIAMOND FILM WITH REDUCED BOWING

This invention was made with Government support, and the Government has certain rights in the invention.

FIELD OF THE INVENTION

This invention relates to synthetic diamond and, more particularly, to a method of making synthetic diamond film with reduced bowing.

BACKGROUND OF THE INVENTION

Diamond has a number of properties which make it attractive for use in various applications. Diamond has the highest thermal conductivity of any known material, and is an electrical insulator, so it is an ideal heat sink material. Other useful properties are extreme hardness, thermal stability, and excellent transmissivity of certain radiation. However, natural diamond is prohibitively expensive for applications which require any substantial size.

In recent years, a number of techniques have been developed for synthesizing diamond and for depositing synthetic diamond to obtain a diamond film or coating. These techniques include so-called high-pressure high-temperature ("HPHT") methods and relatively lower pressure chemical vapor deposition ("CVD") methods. The CVD methods include plasma deposition techniques wherein plasmas are used that include a hydrocarbon and hydrogen. Among the types of known plasma deposition techniques are microwave plasma deposition and plasma jet deposition. In plasma jet deposition, an electrical arc is typically used in forming a plasma that can be focused and accelerated toward a substrate using focusing and accelerating magnets. Reference can be made, for example, to U.S. Pat. Nos. 4,471,003, 4,487,162, and 5,204,144 for description of examples of a type of plasma jet deposition that can be utilized to deposit synthetic diamond on a substrate.

Synthetic diamond film can be deposited, for example, as a permanent coating on a substrate, such as on the wear surface of a tool or as an environmentally protective coating. Such films are generally considered to be relatively thin films. Alternatively, a synthetic diamond film that is generally considered a thick film, can be deposited on a substrate and then removed, preferably intact as a single "free standing" piece, for use in applications such as heat sinks, optical windows, and in tools. However, the obtainment of such thick films, especially of relatively large area, has proven troublesome. In addition to the difficulty of depositing quality synthetic diamond of substantial thickness, there is the problem of removing the diamond intact from the substrate. The substrate material will generally have a different coefficient of expansion than the diamond, as well as a different molecular and chemical structure. The adherence and growth of the diamond film, as well as its release, will depend, inter alia, on the materials used, surface preparation, and deposition parameters. Reference can be made, for example, to copending U.S. patent application Ser. No. 07/973,994, now U.S. Pat. No. 5,314,652, assigned to the same assignee as the present application, which discloses techniques for fabricating free-standing synthetic diamond films utilizing specified substrate roughnesses to help prevent premature lift-off of diamond film and to facilitate appropriate intact release thereof. As disclosed in the referenced copending Application, the substrate can include an interlayer (such as titanium nitride) which further facilitates the technique.

A further problem in CVD synthetic diamond deposition that needs to be addressed is the distortion (called bowing or curling) of the diamond film, particularly after its release from the deposition surface on which it has been deposited. [The deposition surface is any surface on which the diamond is deposited, such as a substrate or mandrel.] It has been recognized that bowing can somehow result from intrinsic stress in the deposited diamond. The U.S. Pat. No. 5,270,077 describes a hot filament diamond deposition technique, wherein a hot filament excites a hydrocarbon and hydrogen gas mixture, which disassociates and results in synthetic diamond being deposited on a heated substrate. The '077 patent indicates that diamond coatings grow in tension due to growth defects and the "intrinsic strain" therein is proportional to the coating thickness and also to the rate of deposition. The '077 patent states that this intrinsic strain manifests itself by a bowing and/or cracking in the diamond film that has been released from a rigid substrate. After release, the diamond film relieves the tensile stress which was within the diamond coating by bowing into a curved configuration or by cracking. The '077 patent indicates that the bowing that results upon release of the tensile stress in the diamond coating can be compensated for by growing the diamond coating on a convex growth surface such that, when the diamond coating is released from the substrate, the diamond coating will relieve the inherent tensile stress therein by bowing into a flat configuration without the formation of cracks or fragmentation. The '007 patent further indicates that the diamond coating can be grown in a curved configuration on the substrate which is opposite to the direction of the stress-relieving deformation that results when the coating is released from the substrate. By matching the curvature of the substrate to the tensile stress created in a CVD diamond film as it grows, the '007 patent indicates that stress-relieving deformation flattens the film when released from the substrate.

SUMMARY OF THE INVENTION

Applicant has found that the direction of bowing described in the U.S. Pat. No. 5,270,077 generally does not occur in the plasma CVD processes employed by Applicant, and that bowing generally occurs in the opposite direction, that is, with the deposition side (not the substrate side) of the diamond bowing to a convex shape.

Applicant has determined that when depositing synthetic diamond with a plasma, and especially with a plasma jet, the use of a concave deposition surface results, after release, in diamond having bowing that is reduced or eliminated as compared to bowing exhibited by diamond made using the same technique but with a flat substrate. Surprisingly, Applicant reduces bowing by using a deposition surface curvature that is diametrically opposed to the deposition surface curvature taught by prior art such as U.S. Pat. No. 5,270,077; that is, by using a concave deposition surface rather than the convex deposition surface of the prior art.

In accordance with an embodiment of the invention, there is disclosed a method for depositing synthetic diamond, comprising the following steps: (a) providing a deposition chamber; (b) providing a deposition surface in said deposition chamber, the deposition surface having a concave contour; (c) directing a plasma toward the concave deposition surface, the plasma including hydrogen and a hydrocarbon, such that synthetic diamond is formed on the concave deposition surface; and (d) releasing the synthetic diamond from the concave deposition surface to obtain free standing diamond.

In a preferred embodiment of the invention, the synthesized diamond has a thickness of at least 100 μm, the concave contour is substantially spherical, and the substantially spherical deposition surface has a radius of curvature in the range 0.5 m to 50 m.

Further features and advantages of the invention will become more readily apparent from the following detailed description when taken in conjunction with the accompanying drawing.

BRIEF DESCRIPTION OF THE DRAWING

The drawing is a cross-sectional schematic representation, partially in block form, of an apparatus that can be used in practicing an embodiment of the invention.

DETAILED DESCRIPTION

Figure 1:
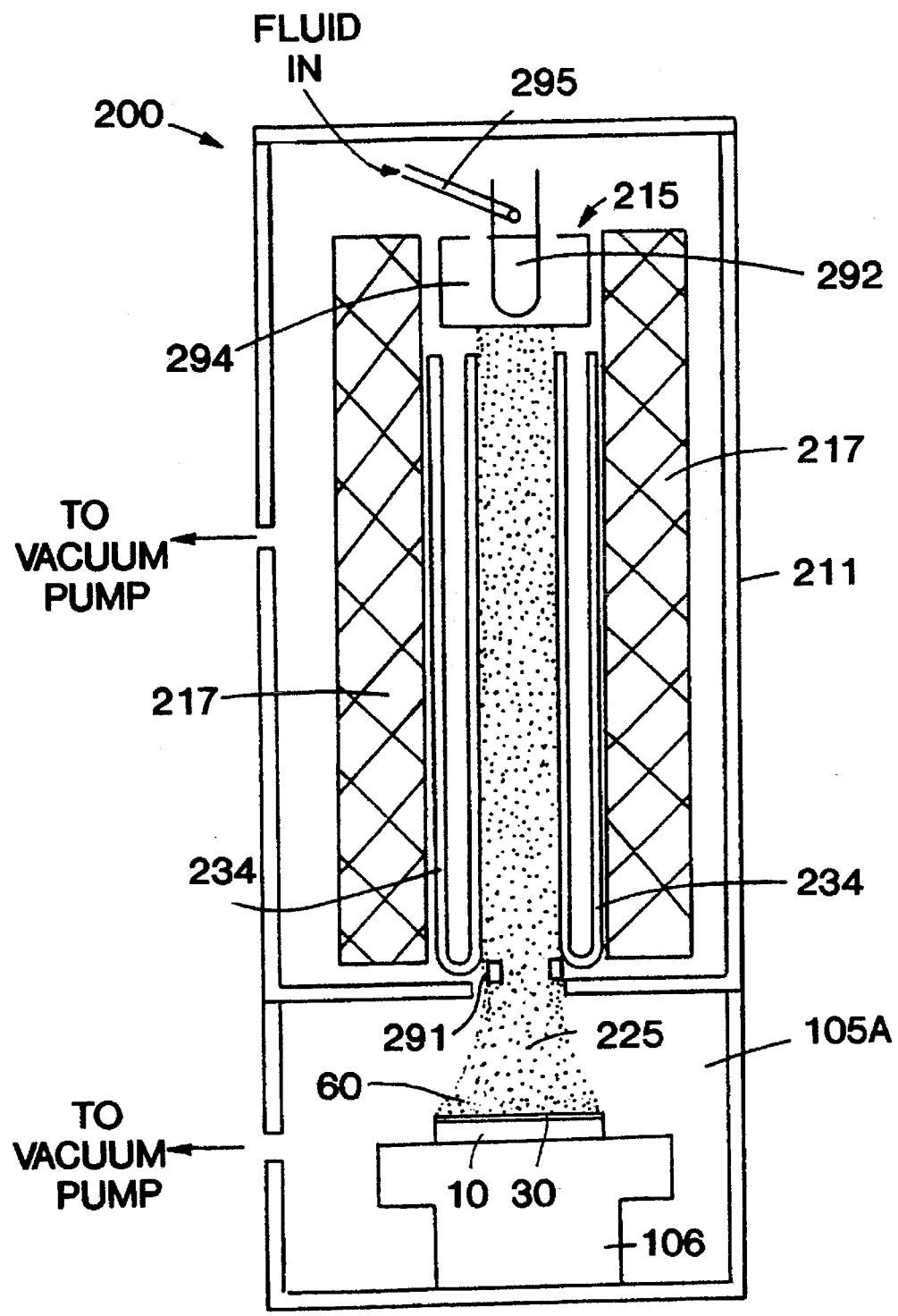

Referring to the drawing, there is shown a diagram of a plasma jet deposition system 200 of a type which can be utilized in practicing an embodiment of the invention. The system 200 is contained within a housing 211 and includes an arc-forming section 215 which comprises a cylindrical cathode holder 294, a rod-like cathode 292, and an injector 295 mounted adjacent the cathode so as to permit injected fluid to pass over the cathode 292. A cylindrical anode is represented at 291. In the illustrated system the input fluid may be a mixture of hydrogen and methane. The anode 291 and cathode 292 are energized by a source of electric potential (not shown), for example a DC potential. Cylindrical magnets, designated by reference numeral 217, are utilized to control the plasma generated at the arc forming section. The magnets maintain the plasma within a narrow column until the hot gases reach the deposition region 60. Optional cooling coils 234, in which a coolant can be circulated, can be located within the magnets.

In operation, a mixture of hydrogen and methane is fed to the injector 295, and a plasma is obtained in front of the arc forming section and accelerated and focused toward the deposition region. The temperature and pressure at the plasma formation region are typically in the approximate ranges 1500–15,000 degrees C. and 100–700 torr, respectively, and in the deposition region are in the approximate ranges 800–1100 degrees C. and 0.1–200 torr, respectively. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. Nos. 4,471,003, 4,487,162, and 5,204,144. It will be understood that other suitable types of deposition equipment, including other types of CVD plasma deposition equipment, can be used in conjunction with the features of the invention.

The bottom portion 105A of the chamber has a base 106 on which can be mounted a substrate 10 on which the synthetic diamond is to be deposited. The base can include a temperature controller. The substrate may be, for example, molybdenum, tungsten, or graphite. Molybdenum, and its alloys such as TZM, which contains relatively small percentages of titanium and zirconium, is presently preferred. Reference can be made, for example, to copending U.S. patent application Ser. No. 973,994, assigned to the same assignee as the present application, which describes considerations of roughness of the substrate with regard to appropriate holding and release of the diamond during and after deposition, and also describes the advantageous use of an interlayer (e.g. illustrated at 30 in FIG. 2), such as a titanium nitride interlayer, for coating the substrate on which the synthetic diamond is to be deposited and ultimately released. The substrate can be tilted and rotated during deposition as described, for example, in U.S. Pat. No. 5,204,144.

EXAMPLES

In an example with a flat deposition surface, the target substrate is a flat 4 inch diameter TZM disc which is tilted and rotated during deposition. The deposition conditions, for equipment of the general type shown in FIG. 1, are as follows:

| | |
|---|---|
| Plasma jet angle | 15 degrees |
| Substrate rpm | 2000 |
| Offset (axis of jet from center of substrate) | 3 cm |
| Temperature at substrate | 900° C. |
| Power | 37 kW |
| Enthalpy | 46 kJ/g H2 |
| Pressure | 13 Torr |
| Methane concentration | 0.1 percent |
| Hydrogen concentration | balance |

Deposition is continued until a synthetic diamond thickness of about 380 μm is obtained. The sample is cooled, released from the substrate, and observed to have a convex bow, as viewed from the deposition side. The sample is cut, with a laser, into 13 mm squares and determined to have a radius of curvature of about 5.3 m.

In a further example, to reduce the bow, a concave substrate is employed. In this case, the TZM substrate is provided with a concave deposition surface. Machining and polishing is used to obtain a substantially spherical contour having a radius of curvature of about 5.3 m. Deposition is implemented using the same equipment and deposition conditions as in the prior example to obtain a synthetic diamond sample having a thickness of about 380 μm. The sample is cut, with a laser, into 13 mm squares and determined to have a radius of curvature of greater than 50 m; i.e., much flatter than the sample made on a flat substrate.

I claim:

1. A method for synthesizing generally flat free-standing diamond, comprising the steps of:

a) providing a deposition chamber;

b) providing a deposition surface in said deposition chamber, said deposition surface having a concave contour;

c) directing a plasma toward said concave deposition surface, the plasma including hydrogen and a hydrocarbon, such that synthetic diamond is formed on said concave deposition surface; and d) releasing said synthetic diamond from said concave deposition surface to obtain free standing diamond, wherein said released synthetic diamond generally flattens.

2. The method as defined by claim 1, wherein said concave contour is substantially spherical.

3. The method as defined by claim 2, wherein said substantially spherical deposition surface has a radius of curvature in the range 0.5 m to 50 m.

4. The method as defined by claim 3, further comprising the step of cutting the diamond into a number of pieces.

5. The method as defined by claim 3, wherein said step of directing a plasma toward said concave deposition surface comprises directing a plasma jet toward said concave deposition surface.

6. The method as defined by claim 3, wherein said step of providing a deposition surface comprises providing a substrate formed of a titanium/zirconium/molybdenum alloy and having said deposition surface.

7. The method as defined by claim 3, wherein said diamond is deposited to a thickness of at least 100 μm.

8. The method as defined by claim 2, further comprising the step of cutting the diamond into a number of pieces.

9. The method as defined by claim 2, wherein said step of directing a plasma toward said concave deposition surface comprises directing a plasma jet toward said concave deposition surface.

10. The method as defined by claim 1, wherein said step of directing a plasma toward said concave deposition surface comprises directing a plasma jet toward said concave deposition surface.

11. The method as defined by claim 1, wherein said step of providing a deposition surface comprises providing a substrate formed of a titanium/zirconium/molybdenum alloy and having said deposition surface.

12. The method as defined by claim 1, wherein said diamond is deposited to a thickness of at least 100 μm.

* * * * *